(12) United States Patent
Kurita et al.

(10) Patent No.: US 8,456,020 B2
(45) Date of Patent: Jun. 4, 2013

(54) SEMICONDUCTOR PACKAGE AND METHOD OF MANUFACTURING THE SAME

(75) Inventors: Yoichiro Kurita, Kanagawa (JP); Masaya Kawano, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 148 days.

(21) Appl. No.: 12/906,377

(22) Filed: Oct. 18, 2010

(65) Prior Publication Data

US 2011/0089561 A1    Apr. 21, 2011

(30) Foreign Application Priority Data

Oct. 16, 2009    (JP) ................... 2009-239676

(51) Int. Cl.
*H01L 23/48*    (2006.01)
*H01L 23/52*    (2006.01)
*H01L 29/40*    (2006.01)

(52) U.S. Cl.
USPC ............... 257/777; 257/737; 257/E23.169; 257/E23.178; 438/109

(58) Field of Classification Search
USPC .................................. 257/E23.169, E23.178
See application file for complete search history.

(56) References Cited

U.S. PATENT DOCUMENTS

| 7,238,548 | B2 | 7/2007 | Kurita et al. |
| 7,554,205 | B2 | 6/2009 | Kurita et al. |
| 2005/0040541 | A1 | 2/2005 | Kurita et al. |
| 2006/0050454 | A1 | 3/2006 | Koudate et al. |
| 2007/0145565 | A1* | 6/2007 | Miyata et al. ............... 257/690 |
| 2007/0184677 | A1* | 8/2007 | Sukegawa et al. ............ 439/66 |
| 2007/0216035 | A1 | 9/2007 | Kurita et al. |
| 2008/0197491 | A1* | 8/2008 | Matsui ....................... 257/737 |
| 2009/0051029 | A1 | 2/2009 | Kurita et al. |

FOREIGN PATENT DOCUMENTS

| JP | 2001-185676 | 7/2001 |
| JP | 2003-332440 | 11/2003 |
| JP | 2005-064362 | 3/2005 |
| JP | 2005-223346 | 8/2005 |
| JP | 2006-80145 | 3/2006 |

OTHER PUBLICATIONS

Japanese Office Action dated Apr. 15, 2013 in corresponding Japanese Application No. 2009-239676 with English translation of enclosed wavy lined portions.

* cited by examiner

*Primary Examiner* — Michelle Mandala
*Assistant Examiner* — Shaka White
(74) *Attorney, Agent, or Firm* — Young & Thompson

(57) ABSTRACT

A semiconductor package has: a first chip; and a second chip. The first chip has: an insulating resin layer formed on a principal surface of the first chip; a bump-shaped first internal electrode group that is so formed in a region of the insulating resin layer as to penetrate through the insulating resin layer and is electrically connected to the second chip; an external electrode group used for electrical connection to an external device; and an electrostatic discharge protection element group electrically connected to the external electrode group. The first internal electrode group is not electrically connected to the electrostatic discharge protection element group.

9 Claims, 23 Drawing Sheets

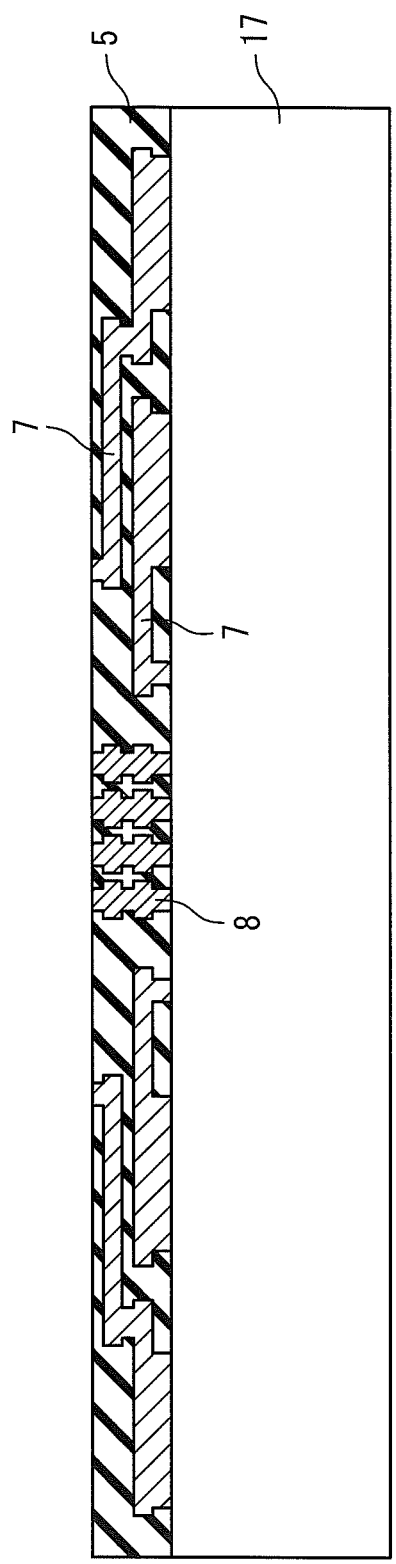

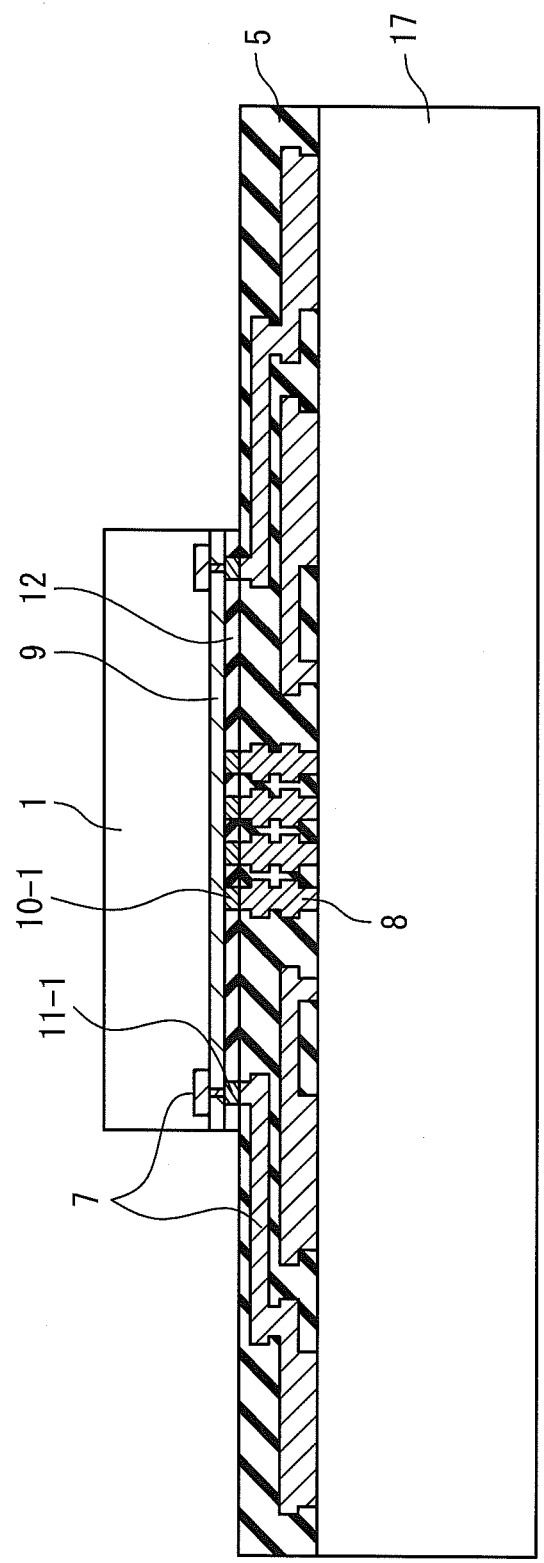

SEMICONDUCTOR PACKAGE AND METHOD OF MANUFACTURING THE SAME

INCORPORATION BY REFERENCE

This application is based upon and claims the benefit of priority from Japanese patent application No. 2009-239676, filed on Oct. 16, 2009, the disclosure of which is incorporated herein in its entirety by reference.

BACKGROUND OF THE INVENTION

1. Field of the Invention

The present invention relates to a semiconductor package and a method of manufacturing thereof.

2. Description of Related Art

A semiconductor package having a plurality of chips is known. Typically, such a semiconductor package is provided with a package substrate, a first chip, a second chip and a sealing body. The first chip is mounted on a principal surface of the package substrate. The second chip is mounted on a principal surface of the first chip. The first chip and the second chip are sealed by the sealing body. The principal surface of the first chip is a circuit formation surface on which circuits are formed. Specifically, an internal electrode group and an external electrode group are formed on the circuit formation surface. The internal electrode group is used for transmitting/receiving signals to/from the second chip. The internal electrode group of the first chip is in contact with an internal electrode group of the second chip. On the other hand, the external electrode group is electrically connected to an external device. The external electrode group is connected through bonding wires to interconnections formed in the package substrate. The external electrode group is electrically connected to the external device through the package substrate.

In order to protect circuit elements of each chip from electrostatic discharge, the each chip is provided with an electrostatic discharge protection circuit (hereinafter referred to as an ESD protection element). Static electricity tends to affect the chip through electrodes. Therefore, the ESD protection elements are typically provided for both of the external electrode group and the internal electrode group.

It should be noted here that the ESD protection element in this specification is an element having the following function: when a voltage of one end of the ESD protection element exceeds a certain value, an internal circuit of the ESD protection element is turned ON and thereby diverting a current caused by the electrostatic discharge.

By the way, the internal electrode group is not directly connected to the external device. It is considered to be unlikely that static electricity is input from another chip in the semiconductor package through the internal electrode group. It is therefore considered that there is little need to provide the ESD protection element for the internal electrode group.

For example, Japanese Patent Publication JP-2005-223346 (Patent Literature 1) discloses a technique in which an electrostatic breakdown protecting transistor (equivalent to the ESD protection element) is not connected to an input/output terminal (equivalent to the internal electrode group) other than that used for testing and for base substrate.

Besides, a related technique is disclosed in Japanese Patent Publication JP-2005-64362 (Patent Literature 2).

However, the inventors of the present application have recognized the following problem regarding the related technique disclosed in the Patent Literature 1 in which no countermeasure against static electricity is taken with respect to the internal electrode group.

When a semiconductor package is manufactured, chips are first generated. Specifically, a wafer is prepared for generating the chips. Then, circuit elements are formed on the wafer. After that, dicing of the wafer is performed and thereby individual chips are obtained. The obtained chip is mounted on a package substrate. Further, the chip is sealed. After that, electrode balls are attached to the package substrate as necessary and thus a semiconductor package is achieved. When the dicing of the wafer is performed, static electricity is likely to be caused by mechanical contact between the wafer and a dicing equipment. Moreover, during an assembly process between the dicing process and the sealing process, the internal electrode group of the chip is exposed and thus the static electricity can be applied to the internal electrode group. The chip is smaller in size than the wafer and is susceptible to the incident static electricity. Therefore, in the case where no countermeasure against static electricity is taken with respect to the internal electrode group, the electrostatic discharge associated with the internal electrode group may be caused during the assembly process. This electrostatic discharge can destroy circuit elements formed in the chip, which is a problem.

Whereas, in a case where the ESD protection element is provided for the internal electrode group, it is disadvantageous in terms of a chip area. Moreover, signal input/output between chips is performed through the ESD protection element, and thus a voltage level of the input/output signal needs to be made higher. As a result, power consumption is increased, which is a problem.

SUMMARY

In an aspect of the present invention, a method of manufacturing a semiconductor package is provided. The method includes: forming an electrostatic discharge protection element group on a wafer; forming a bump-shaped first internal electrode group on a principal surface of the wafer so as not to be electrically connected to the electrostatic discharge protection element group; forming an insulating resin layer on the principal surface of the wafer so as to cover the first internal electrode group; performing dicing of the wafer after the forming the insulating resin layer, to generate a first chip having the first internal electrode group; and connecting the first internal electrode group electrically to a second internal electrode group of a second chip. The connecting step includes: having the first internal electrode group penetrate through the insulating resin layer such that the first internal electrode group and the second internal electrode group are connected with each other.

According to the present invention, the first internal electrode group is covered by the insulating resin layer. Therefore, it is possible to prevent the first internal electrode group from the static electricity after the dicing of the wafer. Moreover, since the first internal electrode group penetrates through the insulating resin layer, the first chip and the second chip can be electrically connected with each other even if the insulating resin layer is present. Furthermore, since the countermeasure against static electricity is taken with respect to the first internal electrode group, there is no need to provide an electrostatic discharge protection element for the first internal electrode group. As a result, an area of circuit elements formed in the first chip can be reduced. Furthermore, it is possible to lower the voltage level of the signal transmitted between the first chip and the second chip. As a result, the power consumption can be reduced.

In another aspect of the present invention, a semiconductor package is provided. The semiconductor package has: a first chip; and a second chip. The first chip has: an insulating resin layer formed on a principal surface of the first chip; a bump-shaped first internal electrode group that is so formed in a region of the insulating resin layer as to penetrate through the insulating resin layer and is electrically connected to the second chip; an external electrode group used for electrical connection to an external device; and an electrostatic discharge protection element group electrically connected to the external electrode group. The first internal electrode group is not electrically connected to the electrostatic discharge protection element group.

According to the present invention, it is possible to prevent the internal electrode group from the static electricity during the assembly process. Furthermore, it is possible to reduce the power consumption.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 4 is a process cross-sectional view showing a method of manufacturing the semiconductor package according to the first embodiment;

FIG. 7 is a process cross-sectional view showing a method of manufacturing the semiconductor package according to the first embodiment;

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

A first embodiment of the present invention will be described below with reference to the attached drawings.

Figure 1:
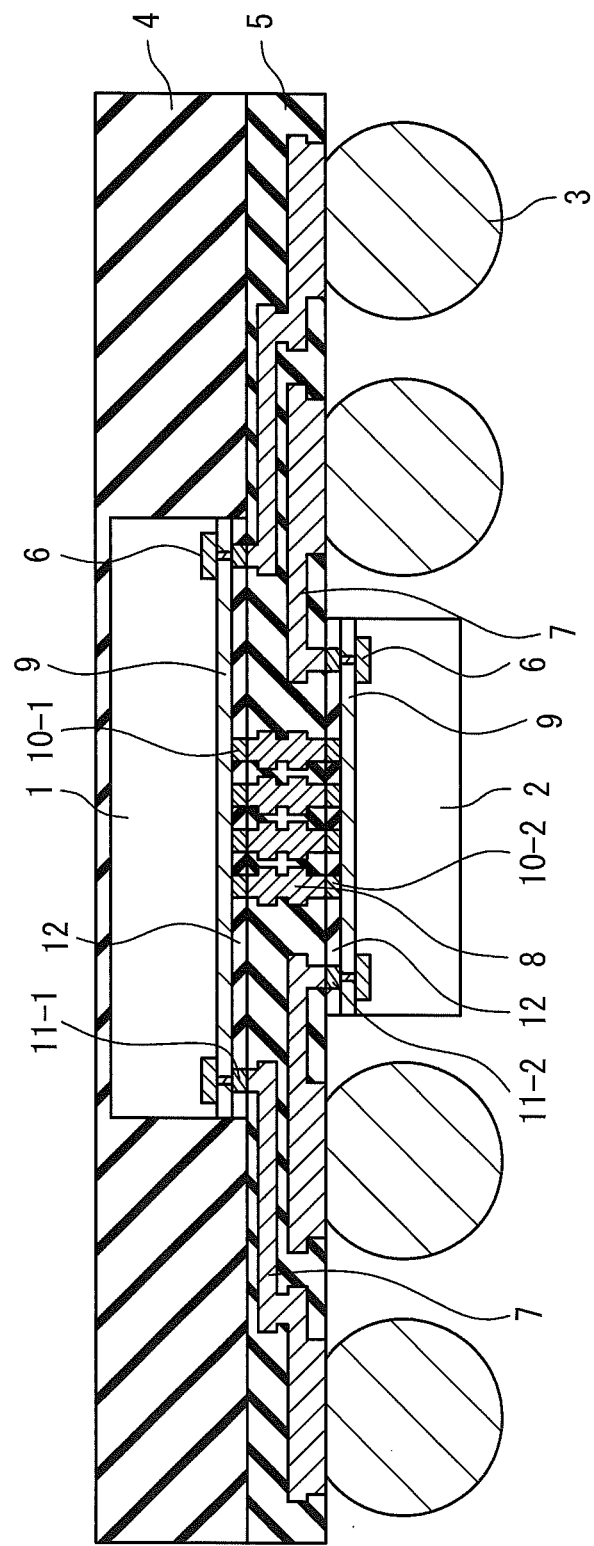
FIG. 1 is a schematic cross-sectional view showing a semiconductor package according to a first embodiment.

FIG. 1 is a schematic cross-sectional view showing a semiconductor package according to the present embodiment. As shown in FIG. 1, the semiconductor package has a package substrate 5 (interposer), a first chip 1, a second chip 2 and a sealing body 4.

The package substrate 5 is a substrate for mounting the first chip 1 and the second chip 2. The package substrate 5 is exemplified by a glass epoxy substrate in which Cu interconnections are formed, a polyimide substrate in which Cu interconnections are formed and the like. The first chip 1 is mounted on a principal surface of the package substrate 5. The second chip 2 is mounted on a back surface of the package substrate 5. Moreover, an internal-connecting interconnection 8 for electrically connecting the first chip 1 and the second chip 2 with each other is formed in the package substrate 5. In addition, external-connecting interconnections 7 used for electrically connecting the first chip 1 and the second chip 2 to an external device (not shown) is formed in the package substrate 5. Moreover, a solder ball electrode 3 is formed on a back surface of the package substrate 5. The external-connecting interconnection 7 is electrically connected to the external device through the solder ball electrode 3.

The first chip 1 is provided with an internal electrode group 10-1 (first internal electrode group), an external electrode group 11-1, an ESD protection element 6 and an insulating resin layer 12. The internal electrode group 10-1 and the external electrode group 11-1 are formed on a circuit formation surface 9 (principal surface) of the first chip 1. The first chip 1 is mounted on the package substrate 5 with the circuit formation surface 9 facing to the package substrate 5. The insulating resin layer 12 is formed on the circuit formation surface 9. Specifically, the insulating resin layer 12 is formed over at least a region in which the internal electrode group 10-1 is formed.

Each internal electrode of the internal electrode group 10-1 has a bump shape (protruded-shape). The internal electrode group 10-1 penetrates through the insulating resin layer 12. The internal electrode group 10-1 is electrically connected to the internal-connecting interconnection 8. The external electrode group 11-1 is electrically connected to the external-connecting interconnection 7.

The ESD protection element 6 is provided for protecting a circuit element of each chip from the electrostatic discharge. Specifically, the ESD protection element 6 is provided for the external electrode group 11-1 and is electrically connected to the external electrode group 11-1. However, the ESD protection element 6 is not provided for the internal electrode group 10-1 and is not electrically connected to the internal electrode group 10-1.

The second chip 2 has a similar configuration to that of the first chip 1. That is, the second chip 2 is provided with an internal electrode group 10-2 (second internal electrode group), an external electrode group 11-2, an ESD protection element 6 and an insulating resin layer 12. The internal electrode group 10-2 penetrates through the insulating resin layer 12 and is electrically connected to the internal-connecting interconnection 8. The external electrode group 11-2 is electrically connected to the external-connecting interconnection 7.

The ESD protection element 6 is electrically connected to the external electrode group 11-2 but is not electrically connected to the internal electrode group 10-2.

The sealing body 4 is so formed on the principal surface of the package substrate 5 as to cover the first chip 1.

Due to the above-described configuration, the first chip 1 and the second chip 2 are electrically connected with each other through the internal electrode groups 10 (10-1, 10-2). Signals are transmitted between the first chip 1 and the second chip 2. Since no ESD protection element is connected to the internal electrode groups 10, power consumption required for the signal transmission can be reduced. Moreover, it is unlikely that static electricity is input to each chip through the internal electrode group 10. Therefore, there is no problem even though the ESD protection element 6 is not connected to the internal electrode group 10.

Next, configurations of the internal electrode group 10 and the external electrode group 11 will be described in detail.

The internal electrode group 10-1 includes: an input electrode that receives an input signal from the second chip 2; and an output electrode that outputs an output signal to the second chip 2. Configuration examples of the input electrode and the output electrode are described below.

Figure 2A:
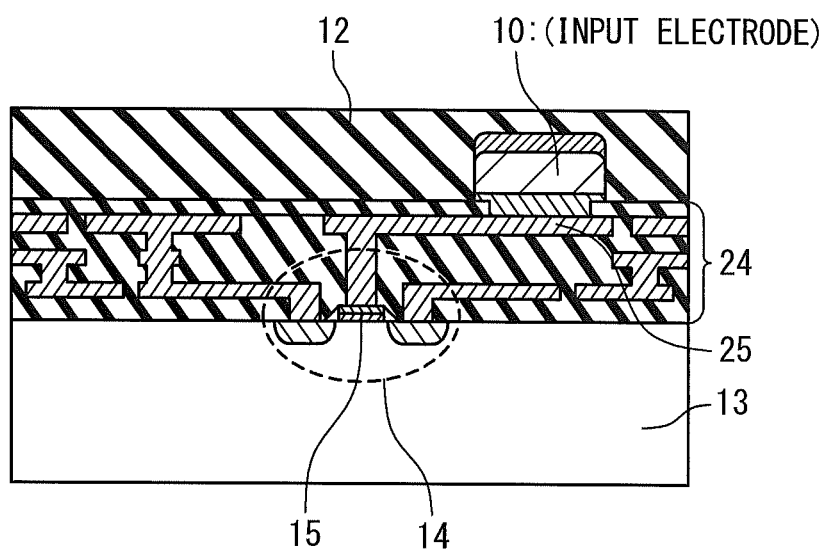
FIG. 2A is a schematic cross-sectional view showing a configuration of an input electrode.

FIG. 2A is a schematic cross-sectional view showing a configuration of the input electrode. In FIG. 2A, vicinity of the input electrode (10) of the first chip 1 is magnified. As shown in FIG. 2A, an input transistor 14 is formed on a semiconductor substrate 13 in the first chip 1. The input transistor 14 is ON/OFF controlled by a voltage level of the input signal supplied to the input electrode. The input electrode is electrically connected to a gate electrode 15 of the input transistor 14 through an interconnection 25 formed in an interconnect layer 24. It should be noted here that no ESD protection element intervenes between the input electrode and the gate electrode 15 of the input transistor 14.

Figure 2B:
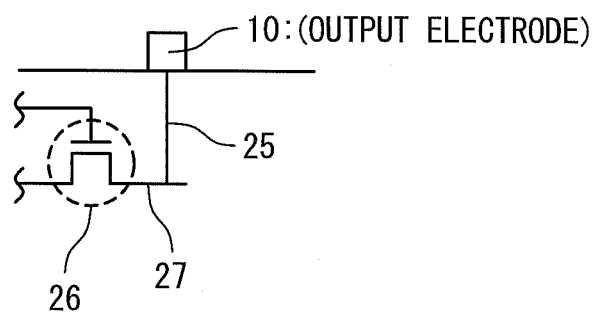
FIG. 2B is a circuit diagram schematically showing a configuration of an output electrode.

FIG. 2B is a circuit diagram schematically showing a configuration of the output electrode. As shown in FIG. 2B, an output transistor 26 for outputting the output signal to the second chip 2 is formed in the first chip 1. The output electrode is electrically connected to a drain electrode 27 of the output transistor 26 through an interconnection 25. It should be noted here that no ESD protection element intervenes between the output electrode and the drain electrode 27.

Meanwhile, as shown in FIG. 1, the external electrode group (11-1, 11-2) is electrically connected to the external device through the external-connecting interconnection 7 and the solder ball 3. Static electricity may be applied to the solder ball 3. However, the external electrode group (11-1, 11-2) is electrically connected to one end of the ESD protection element 6, and the other end thereof is connected to a chip internal circuit. Therefore, influence of the static electricity on the chip internal circuit is eliminated.

Figure 2C:
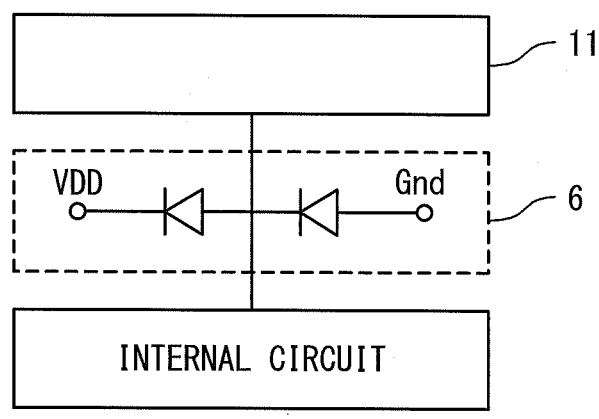
FIG. 2C is a circuit diagram showing an example of an ESD protection element 6.

In the present embodiment, the ESD protection element 6 is an element having the following function: when a voltage of the one end of the ESD protection element 6 exceeds a certain value, an internal circuit of the ESD protection element 6 is turned ON and thereby diverting a current caused by the electrostatic discharge. That is, when a voltage exceeding a certain value (e.g. rated operation voltage) is applied to the one end of the ESD protection element 6, the ESD protection element 6 is activated. As a result, a current caused by the applied voltage is diverted so as not to flow into the other end of the ESD protection element 6. Thus, a voltage of the other end of the ESD protection element 6 is maintained less than a certain value. FIG. 2C is a circuit diagram showing an example of the ESD protection element 6. As shown in FIG. 2C, the ESD protection element 6 can be configured by two diodes that are connected in series. In this case, the external electrode group 11 is connected to a node between the two diodes. It should be noted that the configuration of the ESD protection element 6 is not limited to that shown in FIG. 2C. Other configurations also are possible as long as the same function can be achieved.

In the present embodiment, as shown in FIG. 2A, the ESD protection element 6 is not provided between the input electrode and the gate electrode 15. This means that the input electrode and the gate electrode 15 are connected such that the voltage (input voltage) applied to the input electrode and the voltage (gate voltage) applied to the gate electrode 15 of the input transistor 14 always correspond to each other. Similarly, as shown in FIG. 2B, the ESD protection element 6 is not provided between the output electrode and the drain electrode 27. This means that the output electrode and the drain electrode 27 are connected such that the voltage (drain voltage) applied to the drain electrode 27 and the voltage (output voltage) applied to the output electrode always correspond to each other. Meanwhile, the ESD protection element 6 is provided for the external electrode group 11. This means that when a voltage exceeding a certain value is applied to the external electrode group 11-1, the ESD protection element 6 is activated and thereby a voltage applied to the internal circuit is maintained less than a certain value.

In the semiconductor package according to the present embodiment, as described above, the ESD protection element 6 is connected to the external electrode group 11. Therefore, the internal circuit of the chip is prevented from destruction even when static electricity is externally applied. Meanwhile, static electricity is hardly applied to the internal electrode group 10 of each chip. Therefore, the ESD protection element 6 is not connected to the internal electrode group 10. As a result, it is possible to reduce the circuit area in each chip and thus to reduce the size of each chip. In addition, it is possible to lower the voltage level of the signal transmitted between the first chip 1 and the second chip 2. As a result, the power consumption can be reduced.

However, in a manufacturing process of the semiconductor package, the internal electrode group 10 is exposed. When the internal electrode group 10 is exposed, static electricity may be applied to the internal electrode group 10 of the chip. In view of this, a method of manufacturing the semiconductor package according to the present embodiment is designed as follows.

A method of manufacturing the semiconductor package according to the present embodiment will be described below in detail.

First, the first chip 1 and the second chip 2 are generated. FIGS. 3A to 3D are cross-sectional views for explaining a process of generating each chip.

Figure 3A:
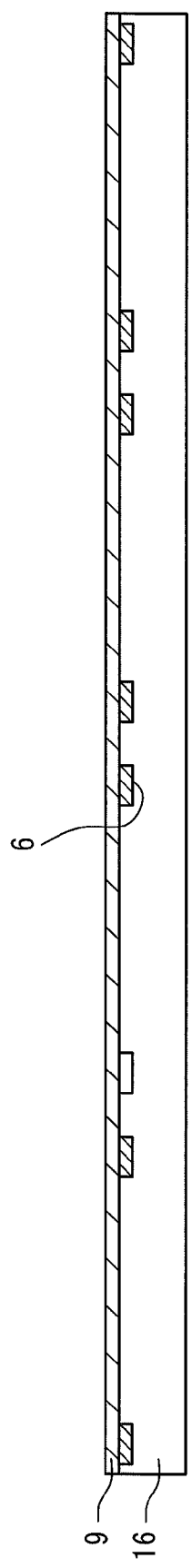
FIG. 3A is a process cross-sectional view showing a method of manufacturing the semiconductor package according to the first embodiment.

As shown in FIG. 3A, a wafer 16 is prepared. Integrated circuits (logic circuit, memory circuit, analog circuit and the like) are formed on a principal surface of the wafer 16. The principal surface of the wafer 16 is the circuit formation surface 9. At this time, the ESD protection element 6 is formed on the wafer 16.

Figure 3B:
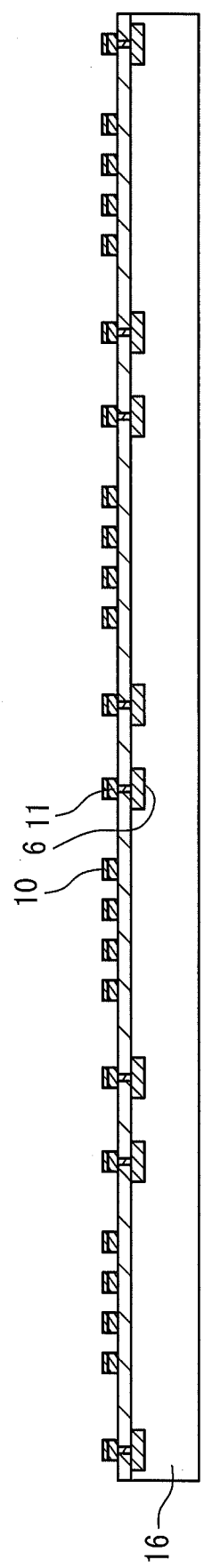
FIG. 3B is a process cross-sectional view showing a method of manufacturing the semiconductor package according to the first embodiment.

Next, as shown in FIG. 3B, the internal electrode group 10 and the external electrode group 11 are formed on the circuit formation surface 9. Each electrode of the internal electrode group 10 and the external electrode group 11 is formed in a bump shape (protruded-shape). Here, the external electrode group 11 is so formed as to be electrically connected to the ESD protection element 6. On the other hand, the internal electrode group 10 is formed so as not to be electrically connected to the ESD protection element 6. Each electrode of the internal electrode group 10 and the external electrode group 11 has an electrode base portion and a solder layer formed on the electrode base portion, which will be described later in more detail.

Figure 3C:
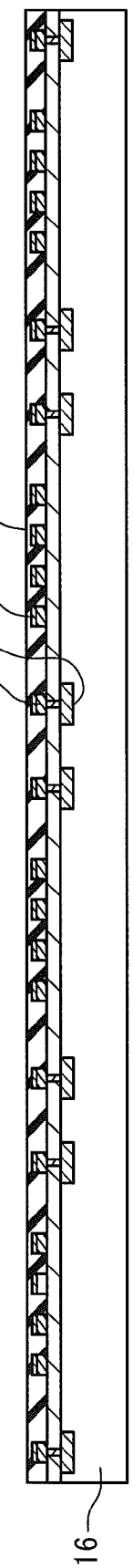
FIG. 3C is a process cross-sectional view showing a method of manufacturing the semiconductor package according to the first embodiment.

Next, as shown in FIG. 3C, the insulating resin layer 12 is formed over the circuit formation surface 9. Specifically, the insulating resin layer 12 is so formed as to cover the external electrode group 11 and the internal electrode group 10. A method of forming the insulating resin layer 12 is not particularly limited. For example, such methods as spin coating, screen printing and resin film laminating can be used. Also, material of the insulating resin layer 12 is not particularly limited. For example, epoxy resin, polyimide resin and the like can be used as the material of the insulating resin layer 12. A thickness of the insulating resin layer 12 is larger than a height of the bump-shaped internal electrode group 10. Due to this process, the internal electrode group 10 is protected by the insulating resin layer 12. As a result, the internal electrode group 10 is prevented from the static electricity.

Figure 3D:
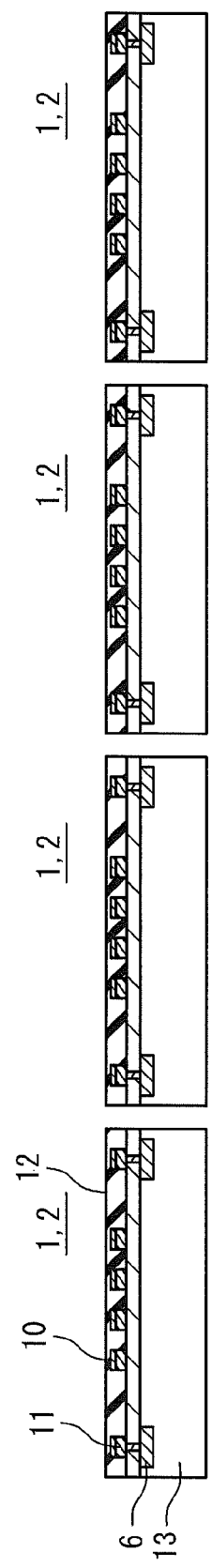
FIG. 3D is a process cross-sectional view showing a method of manufacturing the semiconductor package according to the first embodiment.

Next, as shown in FIG. 3D, dicing of the wafer 16 is performed. As a result, a plurality of chips including the first chip 1 and the second chip 2 are generated.

Meanwhile, the package substrate 5 is prepared. More specifically, as shown in FIG. 4, a support 17 is prepared. The package substrate 5 is formed on the support 17. The internal-connecting interconnection 8 and the external-connecting interconnection 7 are formed in the package substrate 5. For example, the package substrate 5 has a polyimide layer in which Cu interconnections are formed. The support 17 is exemplified by a silicon wafer, a glass wafer and the like.

Figure 5:
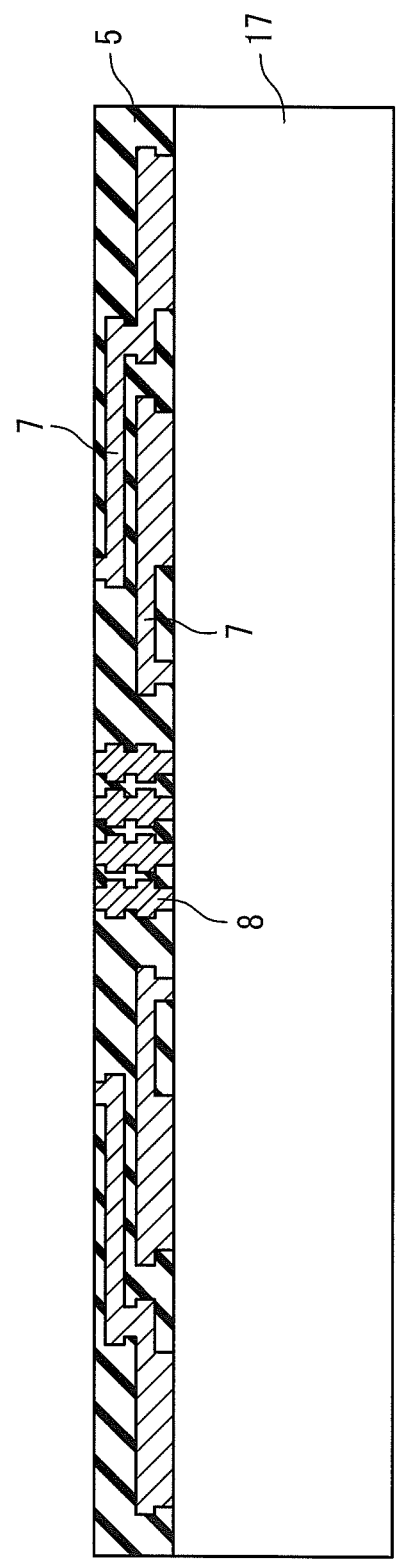
FIG. 5 is a process cross-sectional view showing a method of manufacturing the semiconductor package according to the first embodiment.

Next, as shown in FIG. 5, the first chip 1 is mounted on the principal surface of the package substrate 5. Specifically, the first chip 1 is mounted with the circuit formation surface 9 thereof facing to the package substrate 5. Then, a contact section between the first chip 1 and the package substrate 5 is heated or pressed. Thereby, the insulating resin layer 12 is fluidized. The fluidized insulating resin layer 12 is pushed aside from the upper regions of the internal electrode group 10-1 and the external electrode group 11-1. As a result, the internal electrode group 10-1 and the external electrode group 11-1 penetrate through the insulating resin layer 12 to come in contact with the internal-connecting interconnection 8 and the external-connecting interconnection 7, respectively.

Figure 6A:
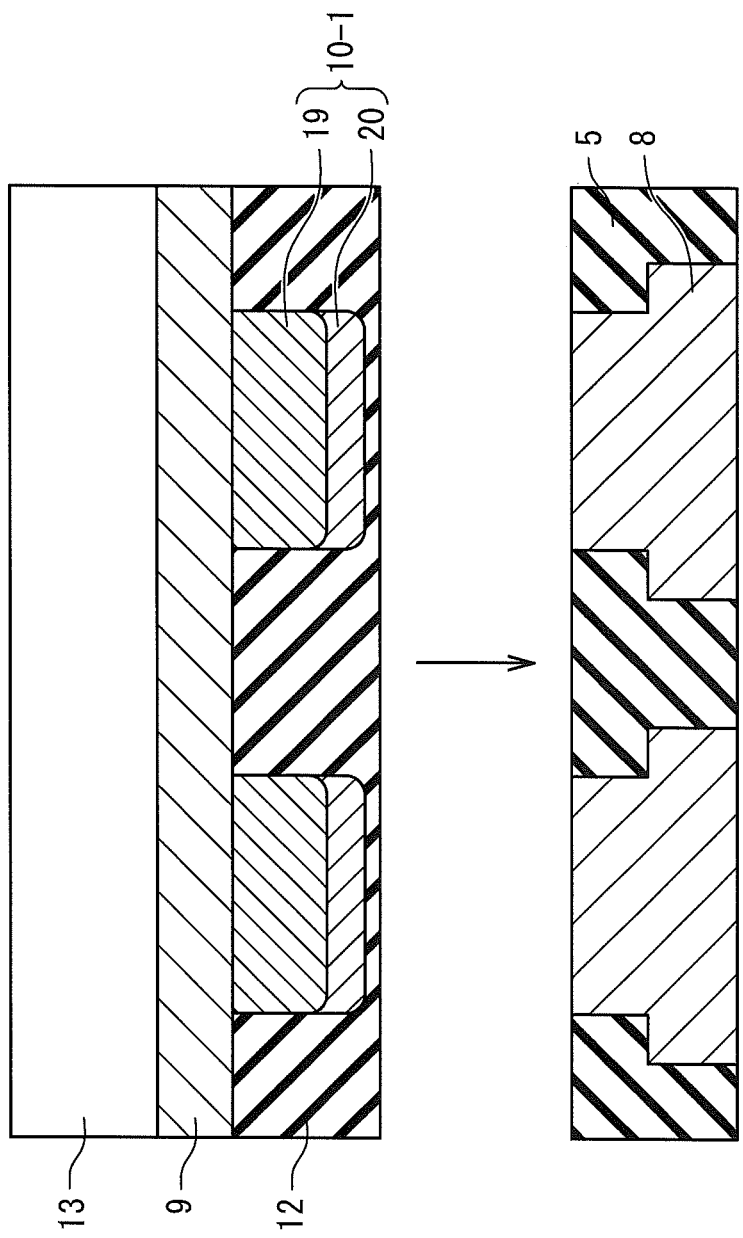
FIG. 6A is a process cross-sectional view showing a method of manufacturing the semiconductor package according to the first embodiment.
Figure 6B:
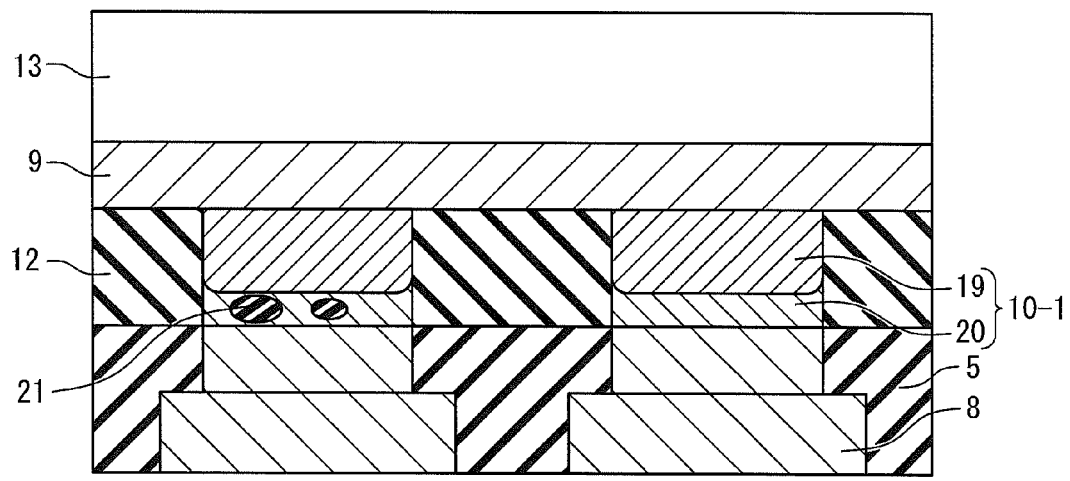
FIG. 6B is a process cross-sectional view showing a method of manufacturing the semiconductor package according to the first embodiment.

FIGS. 6A and 6B show in more detail the process of mounting the first chip 1 on the package substrate 5. As described above, each electrode included in the internal electrode group 10-1 has a conductive electrode base portion 19 and a solder layer 20 formed on the electrode base portion 19 (refer to FIG. 6A). Due to the application of pressure or heat, the insulating resin layer 12 is pushed aside from the upper regions of the electrodes, as shown in FIG. 6B. Moreover, the solder layer 20 is melted due to the application of heat. The melted solder layer 20 comes in contact with the internal-connecting interconnection 8 of the package substrate 5. At this time, an insulating resin constituent 21 being a part of the insulating resin layer 12 that is not pushed aside may remain within the solder layer 20. To put it the other way around, if the insulating resin constituent 21 is found to be included in the solder layer 20, it indicates that there is a high possibility that the internal electrode group 10-1 is brought into contact with the internal-connecting interconnection 8 in the above-described manner.

After the first chip 1 is mounted on the package substrate 5, the sealing body 4 is formed on the principal surface side of the package substrate 5, as shown in FIG. 7. Consequently, the first chip 1 is sealed.

Figure 8:
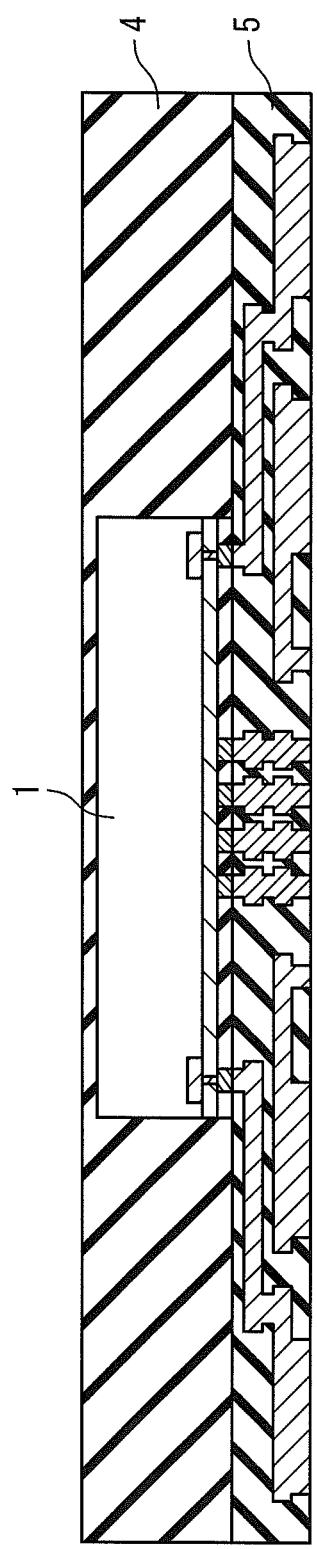
FIG. 8 is a process cross-sectional view showing a method of manufacturing the semiconductor package according to the first embodiment.

Next, as shown in FIG. 8, the support 17 is detached from the package substrate 5.

Figure 9:
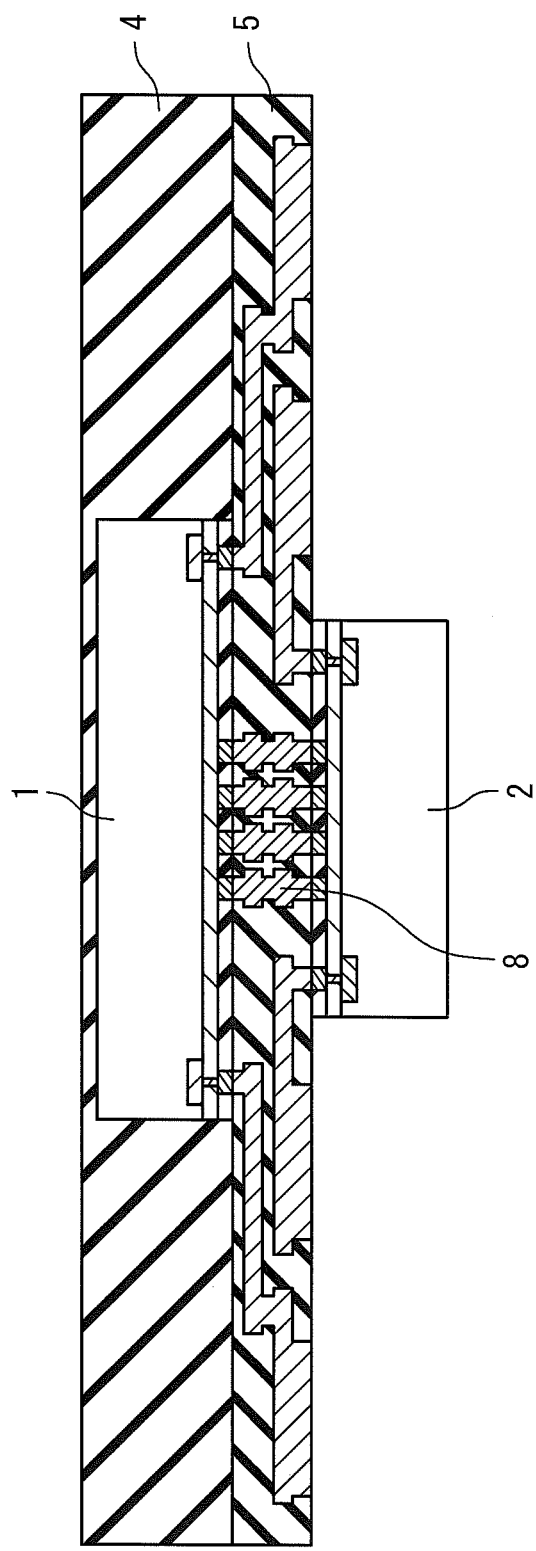
FIG. 9 is a process cross-sectional view showing a method of manufacturing the semiconductor package according to the first embodiment.

Next, as shown in FIG. 9, the second chip 2 is mounted on the back surface of the package substrate 5. The second chip 2 is mounted in a similar manner as in the case of the first chip 1.

After that, the solder ball 3 is formed on the back surface of the package substrate 5. In this manner, the semiconductor package as shown in FIG. 1 can be obtained.

According to the present embodiment, the following effects can be obtained. That is, since the internal electrode group 10 is protected by the insulating resin layer 12, influence of the static electricity during the manufacturing process can be eliminated. Since the internal electrode group 10 is protected from the static electricity during the manufacturing process, there is no need to provide the ESD protection element 6 associated with the internal electrode group 10. As a result, the circuit size in each chip can be reduced. Furthermore, it is possible to lower the voltage level of the signal transmitted between the first chip 1 and the second chip 2. As a result, the power consumption can be reduced. Moreover, the internal electrode group 10 penetrates through the insulating resin layer 12 to be electrically connected to the internal-connecting interconnection 7. That is, it is possible to electrically connect the internal electrode group 10 and the internal-connecting interconnection 8, even though the internal electrode group 10 has been covered by the insulating resin layer 12.

Second Embodiment

Figure 10:
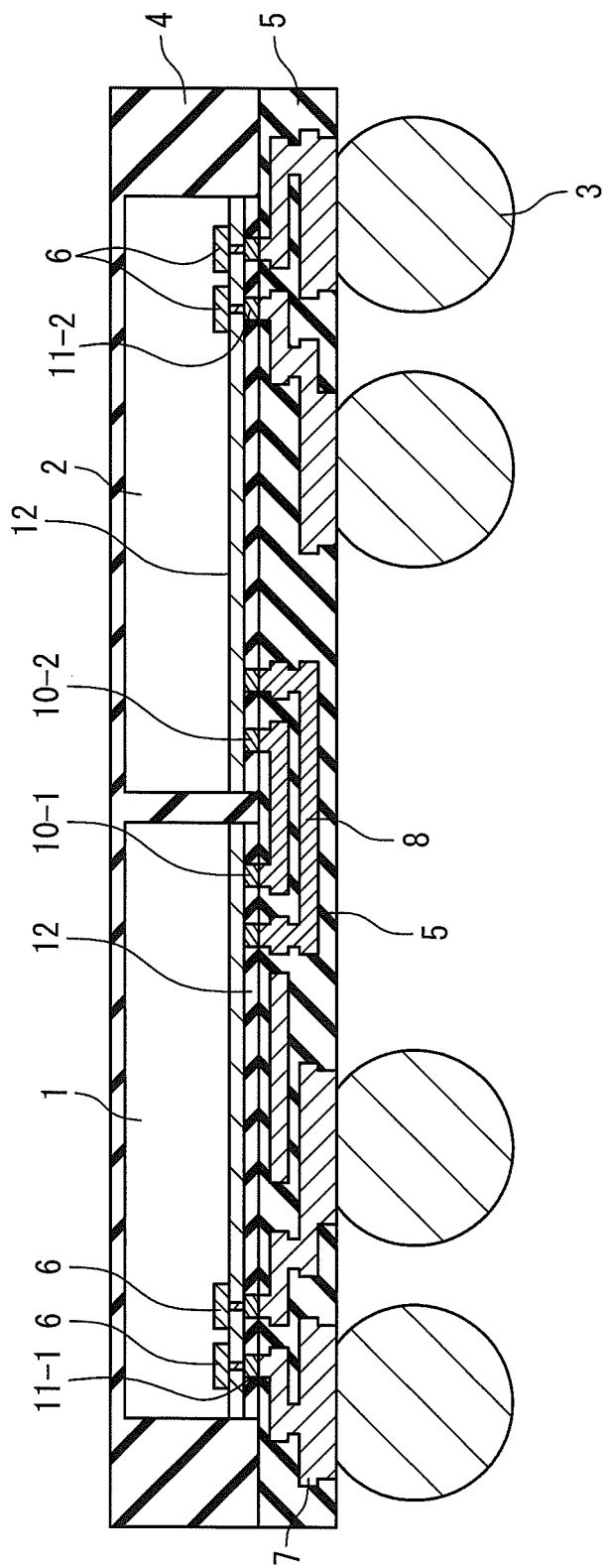
FIG. 10 is a schematic cross-sectional view showing a semiconductor package according to a second embodiment.

Next, a second embodiment of the present invention will be described. FIG. 10 is a schematic cross-sectional view showing the semiconductor package according to the present embodiment. In the present embodiment, both of the first chip 1 and the second chip 2 are mounted on the principal surface of the package substrate 5. The other features are the same as those in the first embodiment, and an overlapping description will be omitted as appropriate.

As shown in FIG. 10, both of the first chip 1 and the second chip 2 are mounted on the principal surface of the package substrate 5 and are sealed by the sealing body 4.

A method of manufacturing the semiconductor package according to the present embodiment will be described below.

Figure 11:
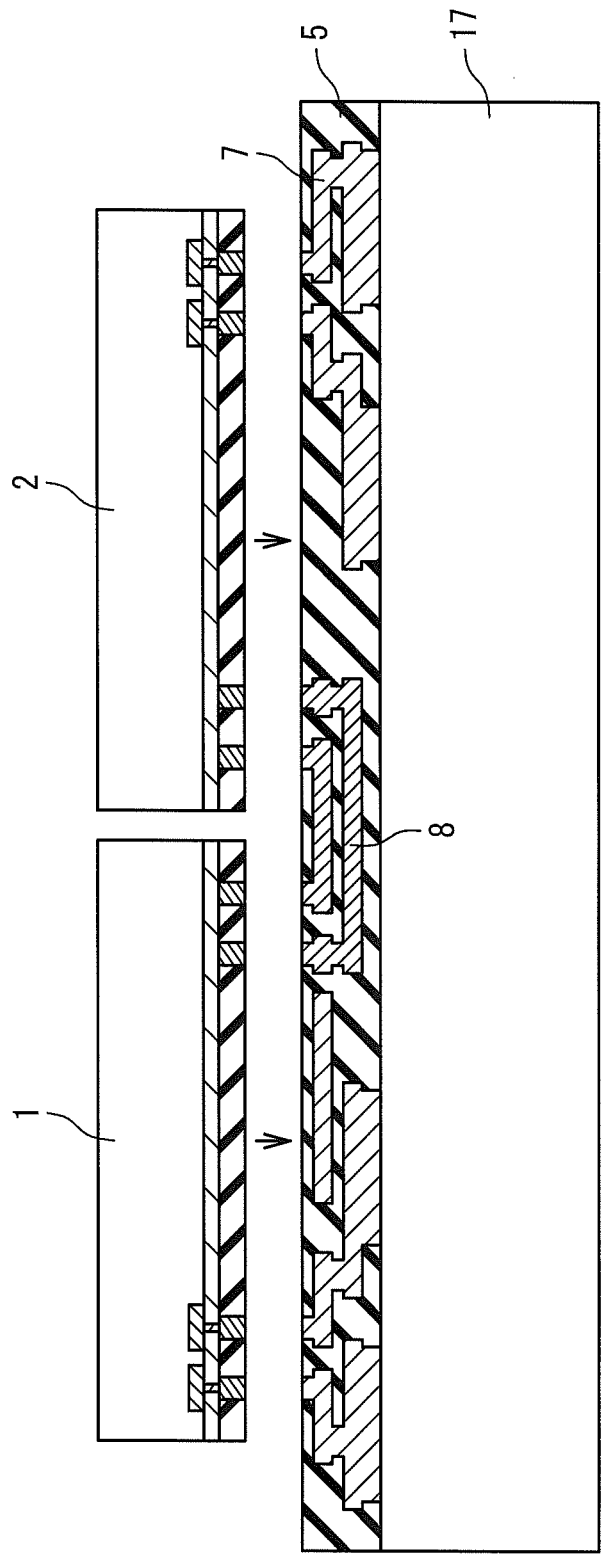
FIG. 11 is a process cross-sectional view showing a method of manufacturing the semiconductor package according to the second embodiment.

As shown in FIG. 11, the package substrate 5 is formed on the support 17. The package substrate 5 has the internal-connecting interconnection 8 and the external-connecting interconnection 7. Then, the first chip 1 and the second chip 2 are mounted on the principal surface of the package substrate 5. Configurations and manufacturing methods of the first chip 1 and the second chip 2 are the same as those in the first embodiment.

Figure 12:
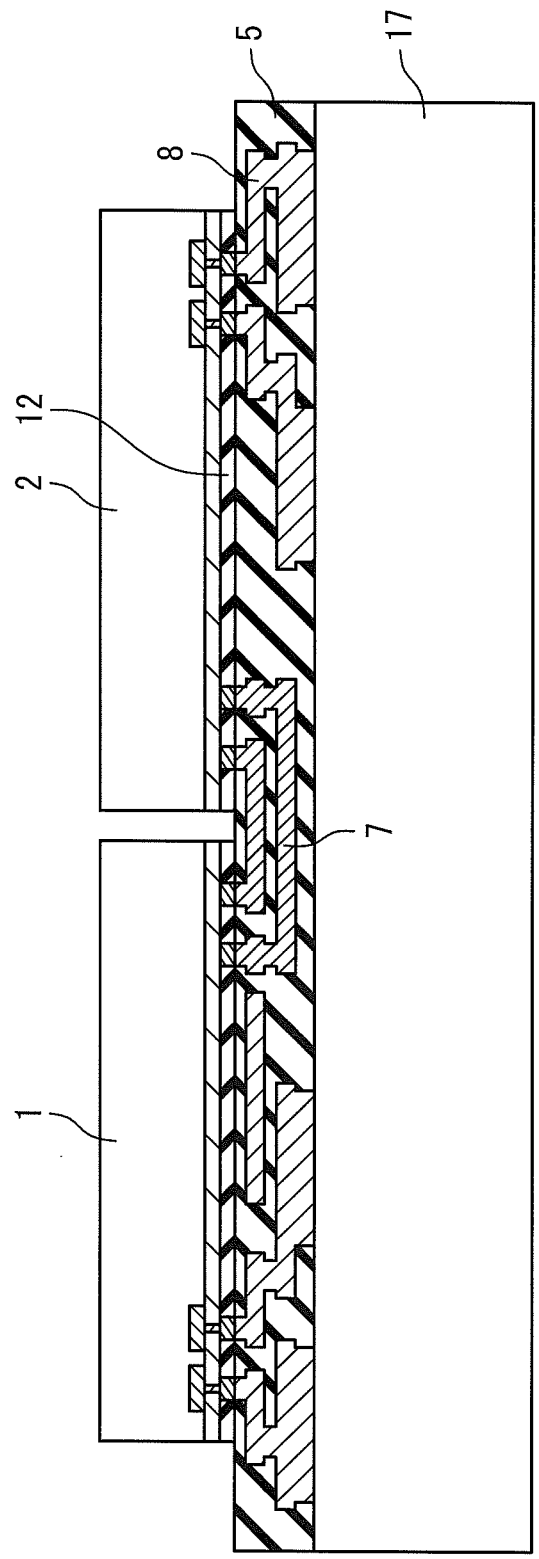
FIG. 12 is a process cross-sectional view showing a method of manufacturing the semiconductor package according to the second embodiment.

Next, as shown in FIG. 12, a contact section between each chip (1, 2) and the package substrate 5 is heated or pressed. As a result, the electrodes of each chip penetrate through the insulating resin layer 12 to come in contact with the interconnections (7, 8) formed in the package substrate 5.

Figure 13:
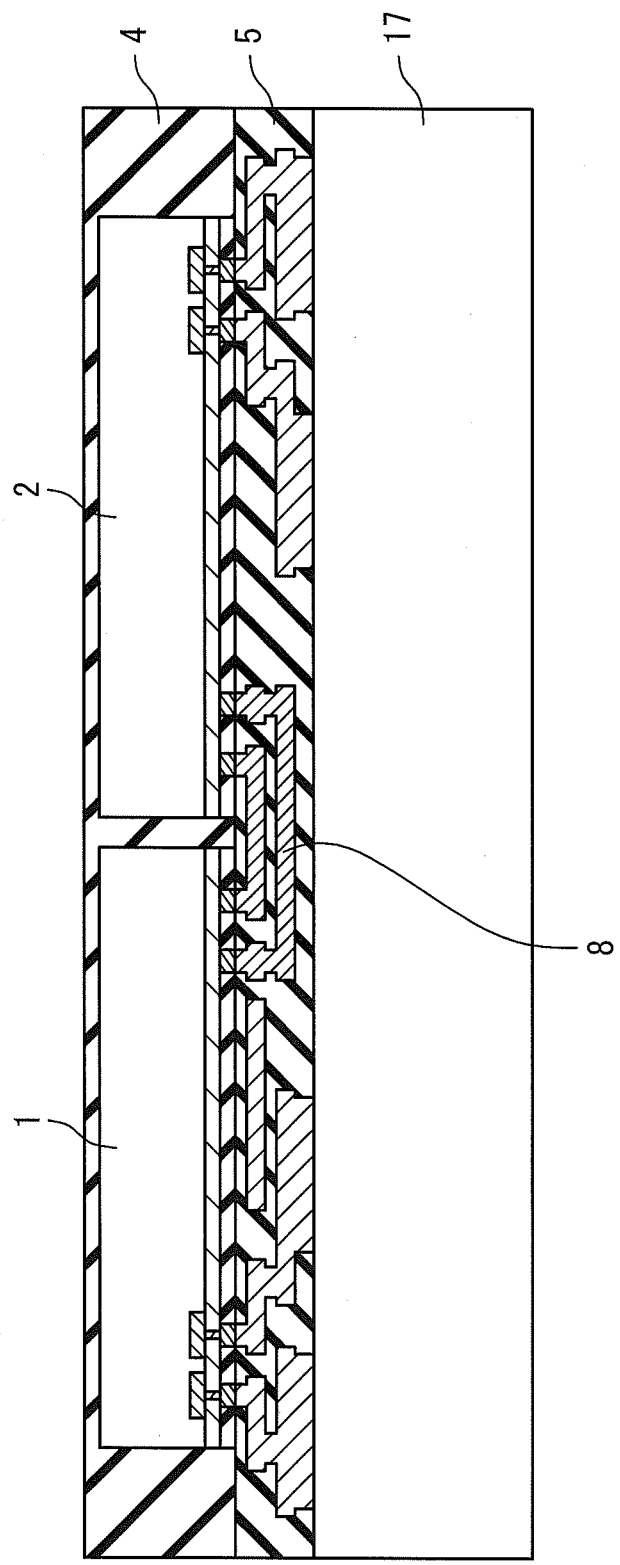
FIG. 13 is a process cross-sectional view showing a method of manufacturing the semiconductor package according to the second embodiment.

Next, as shown in FIG. 13, the sealing body 4 is formed on the principal surface side of the package substrate 5. Consequently, the first chip 1 and the second chip 2 are sealed.

Figure 14:
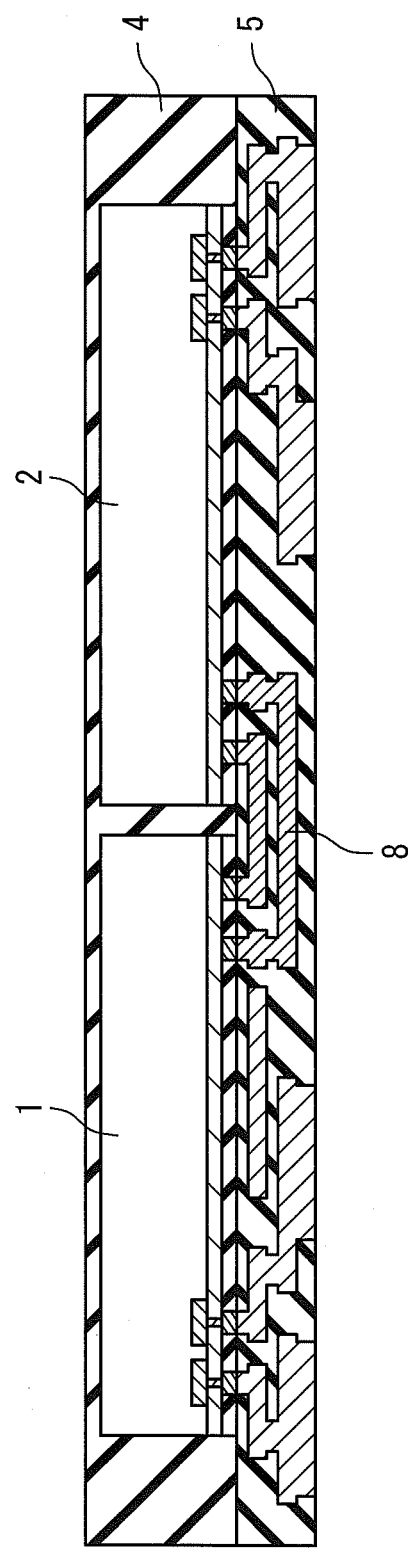
FIG. 14 is a process cross-sectional view showing a method of manufacturing the semiconductor package according to the second embodiment.

Next, as shown in FIG. 14, the support 17 is detached from the package substrate 5.

After that, the solder ball 3 is formed on the back surface of the package substrate 5. In this manner, the semiconductor package as shown in FIG. 10 can be obtained.

According to the present embodiment, the first chip 1 and the second chip 2 are mounted on the principal surface of the package substrate 5. The same effects as in the case of the first embodiment can be obtained by the present embodiment.

Third Embodiment

Next, a third embodiment of the present invention will be described. In the present embodiment, the first chip 1 is mounted on a principal surface of the second chip 2. The other features are the same as those in the above-described embodiments, and an overlapping description will be omitted as appropriate.

Figure 15:
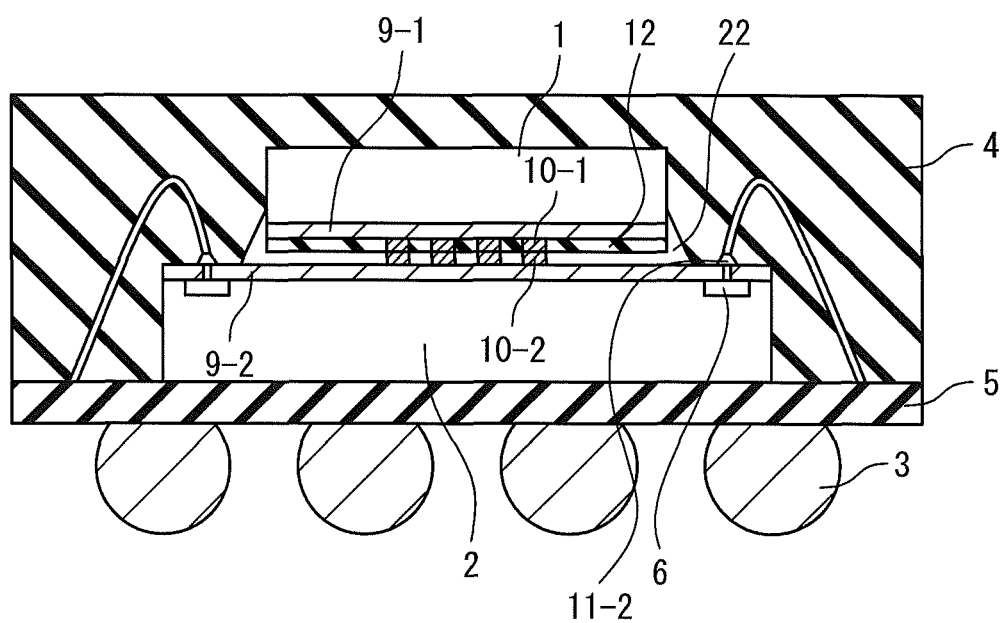
FIG. 15 is a schematic cross-sectional view showing a semiconductor package according to a third embodiment.

FIG. 15 is a schematic cross-sectional view showing the semiconductor package according to the present embodiment.

As shown in FIG. 15, the second chip 2 is mounted on a principal surface of the package substrate 5. Circuits are formed on a principal surface of the second chip 2. That is, the principal surface of the second chip 2 is a circuit formation surface 9-2. Specifically, the external electrode group 11-2 electrically connected to the ESD protection element 6 and the internal electrode group 10-2 that is not electrically connected to the ESD protection element 6 are formed on the circuit formation surface 9-2 of the second chip 2. The external electrode group 11-2 is connected through a bonding wire to an interconnection (not shown) formed in the package substrate 5.

The first chip 1 is mounted on the principal surface of the second chip 2. Specifically, the first chip 1 is mounted such that a principal surface (circuit formation surface 9-1) thereof faces to the second chip 2. The internal electrode group 10-1 and the insulating resin layer 12 are formed on the circuit formation surface 9-1 of the first chip 1. The internal electrode group 10-1 is not electrically connected to the ESD protection element 6. The internal electrode group 10-1 penetrates through the insulating resin layer 12 so as to be in contact with the internal electrode group 10-2.

A gap corresponding to heights of the internal electrode group 10-1 and the internal electrode group 10-2 is generated between the first chip 1 and the second chip 2. In order to fill the gap, an underfill layer 22 is formed between the first chip 1 and the second chip 2.

The first chip 1 and the second chip 2 are sealed by the sealing body 4.

As described above, the semiconductor package according to the present embodiment is a COC (Chip On Chip) type semiconductor package.

Next, a method of manufacturing the semiconductor package according to the present embodiment will be described below.

Figure 16:
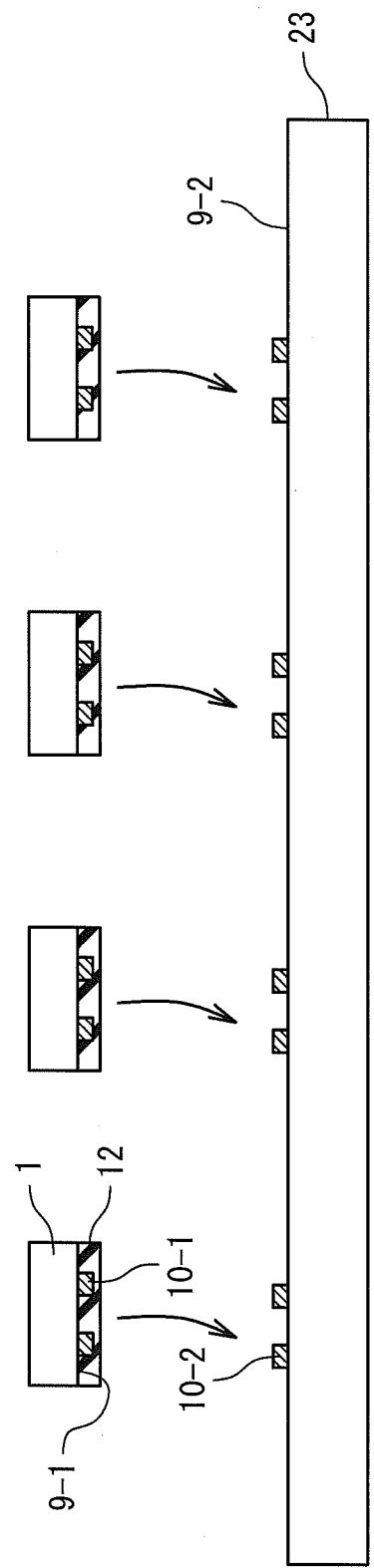
FIG. 16 is a process cross-sectional view showing a method of manufacturing the semiconductor package according to the third embodiment.

As shown in FIG. 16, a second chip-dedicated wafer 23 is prepared. Circuit elements are formed on a principal surface (circuit formation surface 9-2) of the second chip-dedicated wafer 23. At this time, the bump-shaped internal electrode group 10-2 and the external electrode group 11-2 (not shown in FIG. 16) are formed.

Meanwhile, the first chip 1 is generated in the same manner as in the case of the above-described embodiments. That is, the internal electrode group 10-1 and the insulating resin layer 12 covering the internal electrode group 10-1 are formed on the circuit formation surface 9-1 of the first chip 1.

Next, the first chip 1 is mounted on the second chip-dedicated wafer 23. Specifically, a plurality of chip formation regions are present on the second chip-dedicated wafer 23. A plurality of first chips 1 are respectively mounted on the plurality of chip formation regions (corresponding to a plurality of second chips 2) of the second chip-dedicated wafer 23.

Figure 17:
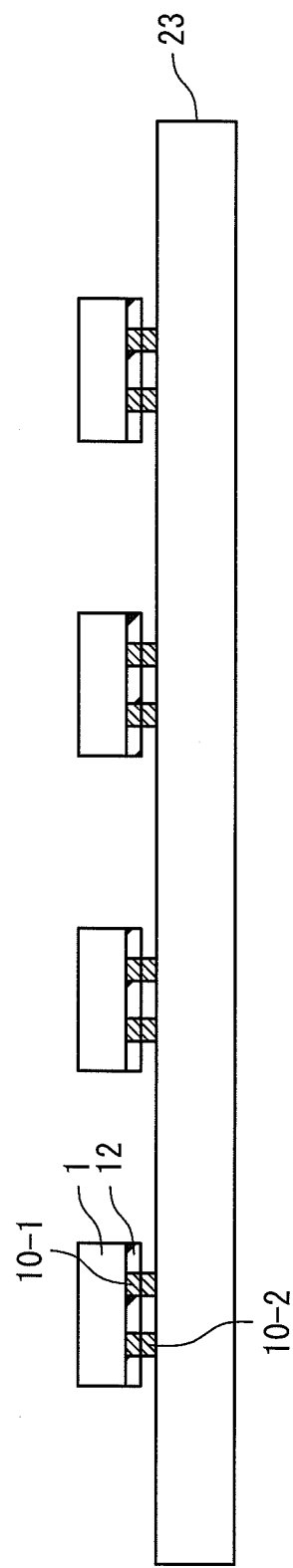
FIG. 17 is a process cross-sectional view showing a method of manufacturing the semiconductor package according to the third embodiment.

Next, as shown in FIG. 17, the internal electrode group 10-1 of the first chip 1 is electrically connected to the internal electrode group 10-2 of the second chip 2, due to application of heat or pressure. As in the case of the above-described embodiments, the internal electrode group 10-1 penetrates through the insulating resin layer 12 to come in contact with the internal electrode group 10-2.

Figure 18:
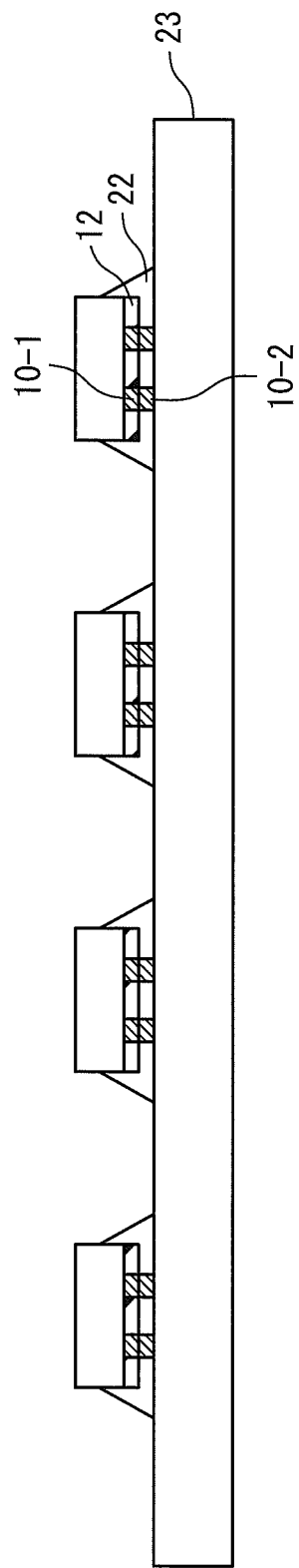
FIG. 18 is a process cross-sectional view showing a method of manufacturing the semiconductor package according to the third embodiment.

Next, as shown in FIG. 18, underfill resin is supplied to the gap between the second chip-dedicated wafer 23 and the first chip 1. As a result, the underfill layer 22 is formed at the gap between the second chip-dedicated wafer 23 and the first chip 1.

After that, dicing of the second chip-dedicated wafer 23 is performed. Consequently, individual chip laminate is obtained. The obtained chip laminate is mounted on the package substrate 5. Furthermore, wire bonding, resin sealing and solder ball formation are carried out. As a result, the semiconductor package as shown in FIG. 15 can be obtained.

The same effects as in the case of the above-described embodiments can be obtained by the present embodiment. Note that in the present embodiment, the internal electrode group 10-2 is exposed on the second chip-dedicated wafer 23. However, the wafer is larger in size than each chip, and influence of static electricity is less in the case of the wafer state. There is no problem even when the internal electrode group 10-2 is exposed on the second chip-dedicated wafer 23.

The first to third embodiments are described above. It should be noted that these embodiments are not independent of each other and can be combined as long as no contradiction occurs.

It is apparent that the present invention is not limited to the above embodiments and may be modified and changed without departing from the scope and spirit of the invention.

The present invention may be summarized as follows.

(1) A method of manufacturing a semiconductor package, comprising:
forming an electrostatic discharge protection element group on a wafer;
forming a bump-shaped first internal electrode group on a principal surface of said wafer so as not to be electrically connected to said electrostatic discharge protection element group;
forming an insulating resin layer on said principal surface of said wafer so as to cover said first internal electrode group;
performing dicing of said wafer after said forming said insulating resin layer, to generate a first chip having said first internal electrode group; and
connecting said first internal electrode group electrically to a second internal electrode group of a second chip,
wherein said connecting comprises: having said first internal electrode group penetrate through said insulating resin layer such that said first internal electrode group and said second internal electrode group are connected with each other.

(2) The method of manufacturing the semiconductor package,
wherein said first internal electrode group includes an input electrode to which an input signal is supplied from said second chip, and
an input transistor that is ON/OFF controlled by said input signal supplied to said input electrode is formed on said wafer,
wherein said forming said first internal electrode group comprises: forming said input electrode so as to be connected to a gate electrode of said input transistor,
wherein said input electrode is connected to said gate electrode of said input transistor such that a voltage corresponding to a voltage applied to said input electrode is always applied to said gate electrode of said input transistor.

(3) The method of manufacturing the semiconductor package,
wherein said first internal electrode group includes an output electrode that supplies an output signal to said second chip, and
an output transistor that outputs said output signal from a drain electrode thereof to said output electrode is formed on said wafer,
wherein said forming said first internal electrode group comprises: forming said output electrode so as to be connected to said drain electrode of said output transistor,
wherein said output electrode is connected to said drain electrode of said output transistor such that a voltage corresponding to a voltage applied to said drain electrode of said output transistor is always applied to said output electrode.

(4) The method of manufacturing the semiconductor package,
wherein said having said first internal electrode group penetrate through said insulating resin layer comprises: applying pressure or heat to fluidize said insulating resin layer.

(5) The method of manufacturing the semiconductor package,
wherein said connecting further comprises:
generating an interposer in which an internal-connecting interconnection is formed;
mounting said first chip on said interposer such that said first internal electrode group is electrically connected to said internal-connecting interconnection; and
mounting said second chip on said interposer such that said second internal electrode group is electrically connected to said internal-connecting interconnection.

(6) The method of manufacturing the semiconductor package,
wherein said mounting said first chip on said interposer comprises: mounting said first chip on a principal surface of said interposer, and
wherein said mounting said second chip on said interposer comprises: mounting said second chip on a back surface of said interposer.

(7) The method of manufacturing the semiconductor package,
wherein said mounting said first chip on said interposer comprises: mounting said first chip on a principal surface of said interposer, and
wherein said mounting said second chip on said interposer comprises: mounting said second chip on said principal surface of said interposer.

(8) The method of manufacturing the semiconductor package,
wherein said connecting further comprises: mounting said first chip on a principal surface of said second chip.

(9) The method of manufacturing the semiconductor package,
wherein said connecting further comprises:
generating a second chip-dedicated wafer on which said second chip is formed;
mounting said first chip on said second chip; and
performing dicing of said second chip-dedicated wafer after said mounting said first chip.

(10) The method of manufacturing the semiconductor package, further comprising: forming an external electrode group on said principal surface of said wafer,
wherein said external electrode group is electrically connected to said electrostatic discharge protection element group.

(11) A semiconductor package comprising:
a first chip; and
a second chip,
wherein said first chip comprises:
an insulating resin layer formed on a principal surface of said first chip;
a bump-shaped first internal electrode group that is so formed in a region of said insulating resin layer as to penetrate through said insulating resin layer and is electrically connected to said second chip;
an external electrode group used for electrical connection to an external device; and
an electrostatic discharge protection element group electrically connected to said external electrode group,
wherein said first internal electrode group is not electrically connected to said electrostatic discharge protection element group.

(12) The semiconductor package,
wherein said first internal electrode group includes an input electrode to which an input signal is supplied from said second chip,
wherein said first chip further comprises: an input transistor that is ON/OFF controlled by said input signal supplied to said input electrode,
wherein said input electrode is connected to a gate electrode of said input transistor such that a voltage corresponding to a voltage applied to said input electrode is always applied to said gate electrode of said input transistor.

(13) The semiconductor package,
wherein said first internal electrode group includes an output electrode that supplies an output signal to said second chip, wherein said first chip further comprises: an output transistor that outputs said output signal from a drain electrode thereof to said output electrode,
wherein said output electrode is connected to said drain electrode of said output transistor such that a voltage corresponding to a voltage applied to said drain electrode of said output transistor is always applied to said output electrode.

(14) The semiconductor package, further comprising: an interposer in which an internal-connecting interconnection is formed,
wherein said first chip is mounted on said interposer such that said first internal electrode group is electrically connected to said internal-connecting interconnection, and
said second chip is mounted on said interposer so as to be electrically connected to said internal-connecting interconnection.

(15) The semiconductor package,
wherein said first chip is mounted on a principal surface of said interposer, and
said second chip is mounted on a back surface of said interposer.

(16) The semiconductor package,
wherein said first chip and said second chip are mounted on a principal surface of said interposer.

(17) The semiconductor package,
wherein said first chip is mounted on a principal surface of said second chip.

What is claimed is:

1. A semiconductor package comprising:
a first chip; and
a second chip,
wherein said first chip comprises:
an insulating resin layer formed on a principal surface of said first chip;
a bump-shaped first internal electrode group that is formed in a region of said insulating resin layer so as to penetrate through said insulating resin layer and is electrically connected to said second chip;
an external electrode group used for electrical connection to an external device; and
an electrostatic discharge protection element group electrically connected to said external electrode group such that the first chip includes a first electrostatic protection element and the second chip includes a second electrostatic protection element, each of the first and second electrostatic protection elements being independently connected to at least one electrode of the external electrode group,
wherein said first internal electrode group is not electrically connected to said electrostatic discharge protection element group.

2. The semiconductor package according to claim 1,
wherein said first internal electrode group includes an input electrode to which an input signal is supplied from said second chip,
wherein said first chip further comprises: an input transistor that is ON/OFF controlled by said input signal supplied to said input electrode,
wherein said input electrode is connected to a gate electrode of said input transistor such that a voltage corresponding to a voltage applied to said input electrode is always applied to said gate electrode of said input transistor.

3. The semiconductor package according to claim 1,
wherein said first internal electrode group includes an output electrode that supplies an output signal to said second chip,
wherein said first chip further comprises: an output transistor that outputs said output signal from a drain electrode thereof to said output electrode,
wherein said output electrode is connected to said drain electrode of said output transistor such that a voltage corresponding to a voltage applied to said drain electrode of said output transistor is always applied to said output electrode.

4. The semiconductor package according to claim 1, further comprising: an interposer in which an internal-connecting interconnection is formed,
wherein said first chip is mounted on said interposer such that said first internal electrode group is electrically connected to said internal-connecting interconnection, and
said second chip is mounted on said interposer so as to be electrically connected to said internal-connecting interconnection.

5. The semiconductor package according to claim 4,
wherein said first chip is mounted on a principal surface of said interposer, and
said second chip is mounted on a back surface of said interposer.

6. The semiconductor package according to claim 4,
wherein said first chip and said second chip are mounted on a principal surface of said interposer.

7. The semiconductor package according to claim 1,
wherein said first chip is mounted on a principal surface of said second chip.

8. A semiconductor package comprising:
a first chip; and
a second chip,
wherein said first chip comprises:
an insulating resin layer formed on a principal surface of said first chip;
a bump-shaped first internal electrode group that is formed in a region of said insulating resin layer so as to penetrate through said insulating resin layer and is electrically connected to said second chip through a wiring connection provided on a substrate to which the first and second chips are mounted;
an external electrode group used for electrical connection to an external device; and
an electrostatic discharge protection element group electrically connected to said external electrode group,
wherein said first internal electrode group is not electrically connected to said electrostatic discharge protection element group.

9. A semiconductor package comprising:
a first chip; and
a second chip,
wherein said first chip comprises:
an insulating resin layer formed on a principal surface of said first chip;
a bump-shaped first internal electrode group that is formed in a region of said insulating resin layer so as to penetrate through said insulating resin layer and is electrically connected to said second chip;
an external electrode group used for electrical connection to an external device; and
an electrostatic discharge protection device comprising a circuit that is activated when an input voltage exceeds a preset value to divert current caused by electrostatic discharge, the electrostatic discharge protection device being electrically connected to said external electrode group,
wherein said first internal electrode group is not electrically connected to said electrostatic discharge protection element group.

* * * * *